US011836042B2

United States Patent
Jain et al.

(10) Patent No.: US 11,836,042 B2
(45) Date of Patent: *Dec. 5, 2023

(54) PAYLOAD DISTRIBUTION IN SOLID STATE DRIVES

(71) Applicant: Kioxia Corporation, Tokyo (JP)

(72) Inventors: Amit Jain, Cupertino, CA (US); Gyan Prakash, San Jose, CA (US); Ashwini Puttaswamy, Cupertino, CA (US)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/993,121

(22) Filed: Nov. 23, 2022

(65) Prior Publication Data

US 2023/0090719 A1    Mar. 23, 2023

Related U.S. Application Data

(63) Continuation of application No. 17/496,933, filed on Oct. 8, 2021, now Pat. No. 11,526,397, which is a
(Continued)

(51) Int. Cl.
*G06F 11/10* (2006.01)
*G06F 11/07* (2006.01)
(Continued)

(52) U.S. Cl.
CPC ........ *G06F 11/1068* (2013.01); *G06F 11/076* (2013.01); *G06F 11/0763* (2013.01);
(Continued)

(58) Field of Classification Search
CPC ............... G06F 11/1068; G06F 11/076; G06F 11/0763; G06F 11/3037; G06F 12/0882; G11C 11/4085
(Continued)

(56) References Cited

U.S. PATENT DOCUMENTS 9,430,326 B2 * 8/2016 Barndt ................ G06F 11/1068
9,483,350 B1 * 11/2016 Camp ................ G06F 11/1072
(Continued)

FOREIGN PATENT DOCUMENTS

CN    105302659 A    2/2016
CN    107357678 A    11/2017

OTHER PUBLICATIONS

Lim at al., Compression-Assisted Adaptive ECC and RAID Scattering for NAND Flash Storage Devices, May 22, 2020, MDPI, pp. 1-19. (Year: 2020).

*Primary Examiner* — John J Tabone, Jr.
(74) *Attorney, Agent, or Firm* — Allen & Overy LLP

(57) ABSTRACT

A method performed by a controller of a solid state drive (SSD) comprising receiving from a host a write request to store write data in a nonvolatile semiconductor storage device of the SSD. The method also comprises identifying a first codeword and a second codeword stored in the nonvolatile storage device, the first codeword and the second codeword configured to store write data corresponding to the write request. Responsive to the write request, the method comprises writing a first portion of the write data to the first codeword and writing a second portion of the write data to the second codeword, and sending a message to the host once the write data has been written to the nonvolatile semiconductor storage device. The first and second codewords are adjacently stored, and the write data has a length that is greater than the length of the first and second codewords.

42 Claims, 7 Drawing Sheets

Related U.S. Application Data continuation of application No. 16/932,047, filed on Jul. 17, 2020, now Pat. No. 11,144,392.

(51) Int. Cl.
*G11C 11/408* (2006.01)
*G06F 11/30* (2006.01)
*G06F 12/0882* (2016.01)

(52) U.S. Cl.
CPC ...... *G06F 11/3037* (2013.01); *G06F 12/0882* (2013.01); *G11C 11/4085* (2013.01)

(58) Field of Classification Search
USPC ............... 714/769, 767, 772, 773, 779, 763; 365/185.33, 185.09
See application file for complete search history.

(56) References Cited

U.S. PATENT DOCUMENTS

| | | | |
|---|---|---|---|
| 2013/0246891 A1* | 9/2013 | Manning | G11C 29/52 714/773 |
| 2016/0026525 A1* | 1/2016 | Barndt | G06F 11/1068 714/773 |
| 2016/0148702 A1* | 5/2016 | Karakulak | G11C 29/021 365/185.12 |
| 2016/0162353 A1* | 6/2016 | Manohar | G06F 11/1048 714/760 |
| 2016/0246603 A1* | 8/2016 | Watanabe | G06F 9/3001 |
| 2021/0157727 A1* | 5/2021 | Meyerowitz | G06F 12/0804 |

\* cited by examiner

PAYLOAD DISTRIBUTION IN SOLID STATE DRIVES

CROSS-REFERENCE TO RELATED APPLICATIONS

This application is a continuation of U.S. application Ser. No. 17/496,933 filed on Oct. 8, 2021, which is a continuation of U.S. application Ser. No. 16/932,047 filed on Jul. 17, 2020, the entire contents of which are incorporated herein by reference.

FIELD

The present disclosure relates to solid-state drives and methods that provides a common infrastructure that dynamically adjusts to changes in coderate of the solid-state drive to enable efficient transfer of data when processing a write request from a host.

BACKGROUND

A solid-state drive (SSD) generally has faster performance, is more compact, and is less sensitive to vibration or physical shock than a conventional magnetic disk drive. Given these advantages, SSDs are being used in more and more computing devices and other consumer products in lieu of or in addition to magnetic disk drives, even though the cost-per-gigabyte storage capacity of SSDs is significantly higher than that of magnetic disk drives.

SSDs utilize physical memory cells that comprise nonvolatile semiconductor storage devices, such as NAND devices, to store data. A controller is used in an SSD to manage the transfer of data between a host and the memory cells of the SSD. Writing data to and reading data from the physical memory cells of SSDs typically involves shuffling data between various memory cells.

Until now the size of the memory pages (e.g. NAND pages) in memory cells of an SSD have been configured such that they were able to accommodate multiple data payloads per data unit of the memory page, and the error correction code (ECC) bits would lie in a reserved area of the memory page which was available principally to handle error correction. However, this has drastically changed as there is an increasing trend in current memory technology to squeeze more data onto each data page of the memory by assigning more data bits to each memory cell. At the same time, the bit error rate (BER) on such data pages within the memory increases as the memory ages, necessitating increasing number of ECC bits which may exceed the space available in the reserved area of the memory page.

In order to maintain good throughput and latency on the workload without decreasing the efficiency of the memory by performing elaborate error correction, a larger number of error correction code (ECC) bits are built into each data unit. Increasing the amount of ECC bits per data unit takes away from the physical space that could be used to store the payload data from a host. While the physical space in the memory for the payload data from the host decreases over time, the size of the payload itself does not change. For example in a 16 kilobyte (KB) NAND memory page, the increase in the BER means that there would be a larger portion of the 16 KB NAND memory page that would be dedicated to the ECC for the data stored in the page. This takes away from the physical NAND memory space for the payload data, which was supposed to be 16 KB, but is now considerably less due to the larger size of the ECC required.

It therefore follows that each data payload would spill across more than one data unit in the memory. This imposes a challenges on how to manage the stored data during data transfers, such as during a write request.

SUMMARY

According to an embodiment of the present disclosure there is provided a method performed by a controller of a solid state drive. The method comprises receiving from a host, a write request to store write data in one or more of a plurality of nonvolatile semiconductor storage devices of the solid state drive. The method also comprises identifying a first codeword and a second codeword from a plurality of codewords stored in the one or more of the plurality of nonvolatile storage devices, the first codeword and the second codeword configured to store write data corresponding to the write request. Responsive to the write request, the method comprises writing a first portion of the write data to the first codeword and writing a second portion of the write data to the second codeword. Further the method comprises sending a message to the host once the write data has been written to the nonvolatile semiconductor storage devices. Here the second codeword is adjacent to the first codeword as stored in the one or more of the plurality of nonvolatile storage devices, and the write data has a data length that is greater than a first data length of the first codeword or a second data length of the second codeword.

In some implementations, and prior to writing the first portion of the write data to the first codeword, the method further comprises the step of generating a bitmap in each codeword which identifies whether a codeword is located on a good page or a bad page. In certain implementations, the method further comprises the steps of reading the bitmap associated with the codeword to determine if the second codeword is located on a bad page, and skipping to a codeword on a next good page if the second codeword is located on a bad page. In further implementations, the controller stores a pointer for each codeword in a logical cluster address (LCA) to media cluster address (MCA) look up-table. In some implementations, the method comprises the step of updating a pointer with an MCA corresponding to the first codeword at which the first portion of the write data begins.

In certain implementations, the method also comprises the steps of determining a codeword offset corresponding to the MCA of the first codeword, the codeword offset identifying the first codeword in the plurality of codewords in which the write data begins, and determining a codeword offset corresponding to the MCA of the second codeword. In other implementations, the method comprises the step of identifying a spill offset associated with the first codeword offset, the spill offset identifying a position within the first codeword at which the first portion of the write data begins. In further implementations, the method comprises the steps of writing the first portion of the write data from the spill offset of the first codeword to the end of the first codeword, and writing the second portion of the write data from the start of the second codeword to a spill offset of the second codeword. In some implementations, the method further comprises the steps of calculating the second portion of the write data, responsive to the second portion of the write data spilling over to a next adjacent codeword, determining a spill offset of the next adjacent codeword, and writing the spilled second portion of the write data to the next adjacent codeword.

In other implementations, the writing is performed by a feeder module coupled to the host interface. In further implementations, the method also comprises the step of determining a codeword offset. In some implementations, all remaining steps are performed by a consumer module coupled to the plurality of nonvolatile semiconductor storage devices.

In further implementations, the method comprises the step of indexing into a codeword look-up table which maps an MCA in the nonvolatile semiconductor storage devices at which the write is to be stored. In some implementations, the method also comprises the step of indexing into a payload spill boundary look-up table which maps a codeword in the nonvolatile semiconductor storages devices to a spill offset. In certain implementations, the first data length and the second data length are equal. The method then additionally comprises the steps of determining a data spill per codeword by subtracting the first data length from a data length of the write data, determining a total spill in the nonvolatile semiconductor storage device for each codeword offset by multiplying the spill per codeword by the codeword offset, and determining the spill offset by dividing the total spill by the first data length.

In some implementations, the plurality of codewords are stored on one or more wordlines in the nonvolatile semiconductor storage devices. In certain implementations, each of the wordline has a different code rate. In other implementations, the method further comprises the step of generating a payload spill boundary look-up table for each code rate. In further implementations, the method also comprises the step of storing the code rate of the nonvolatile semiconductor storages device in a configuration file in a read-only memory within the controller. In some implementations, the method further comprises the steps of determining a bit error rate associated with each of the plurality of nonvolatile semiconductor storage devices, adjusting the code rate of at least one of the nonvolatile semiconductor storage devices based on the bit error rate, and updating the code rate in the configuration file. In certain implementations, each of the plurality of the nonvolatile semiconductor storage devices comprises a NAND memory.

BRIEF DESCRIPTION OF DRAWINGS

The foregoing and other objects and advantages will be apparent upon consideration of the following detailed description, taken in conjunction with the accompanying drawings, in which like reference characters refer to like parts throughout, and in which.

DETAILED DESCRIPTION

To provide an overall understanding of the devices described herein, certain illustrative embodiments will be described. Although the embodiments and features described herein are specifically described for use in connection with an SSD having a controller, it will be understood that all the components and other features outlined below may be combined with one another in any suitable manner and may be adapted and applied to other types of SSD architectures with memories having smaller data frames due to higher BER.

Figure 1:
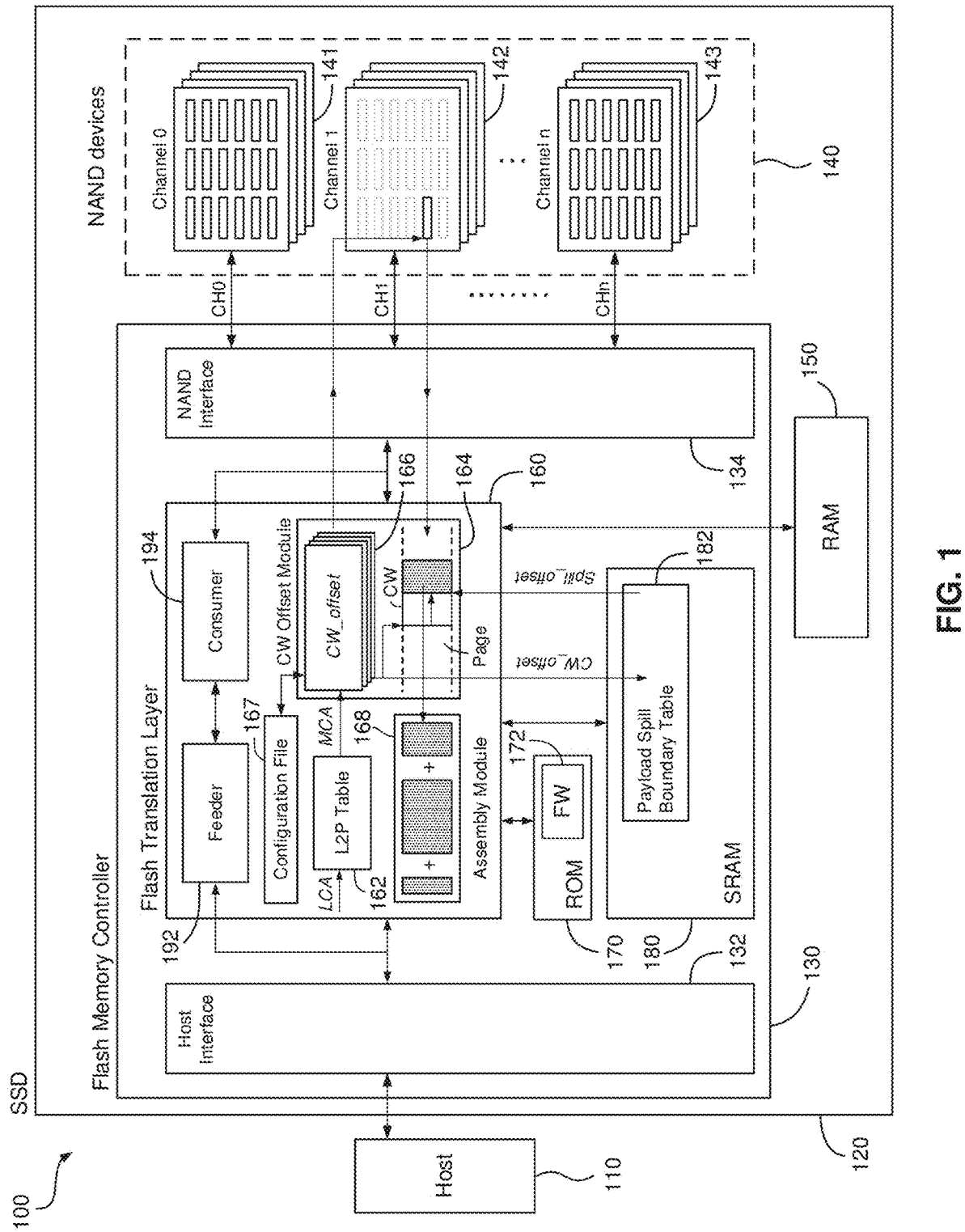
FIG. 1 shows a schematic representation of a solid-state drive (SSD), configured according to one or more embodiments of the present disclosure.

FIG. 1 is a block diagram of a computing system 100 comprising at least one host 110 in communication with a storage device 120. The host 110 is a computing system that comprises processors, memory, and other components as is generally known in the art, and which is not shown in FIG. 1 for the sake of brevity. Storage device 120 provides nonvolatile storage functionality for use by the host 110. Storage device 120 is a SSD, which is a nonvolatile storage device that may include an integrated circuit comprising a controller 130. The controller 130 is communicatively coupled to nonvolatile semiconductor-based storage elements 140 as the storage medium. Such semiconductor-based storage elements 140 may comprise NAND-based flash memory devices 141-143, for example. SSD 120 also includes a memory external to the controller 130, such as a random access memory (RAM) 150. In some implementations, the RAM 150 may comprise a dynamic RAM (DRAM). DRAM 150 comprises several buffers used to buffer data during read and write operations between the host 110 and the storage elements 140.

The storage elements 140 may comprise a plurality of NAND chips, such as, for example, 32, 64, 128, 256 separate NAND chips. Each NAND chip or die may comprise a plurality of blocks, each of which comprises a plurality of pages. Each page stores payload data from the host 110 in codewords. Further each page may be divided into a lower page, middle page and upper page. Such a structure of the storage elements 140 is important in forming a wordline for data transfer as it determines the write sequence and read sequence of data transferred to and from the storage elements 140.

The controller 130 comprises a host interface 132 which enables communication with the host 110 for the receipt of read and write requests, for example. Controller 130 also includes an interface 134 for communication with the storage elements 140. Interface 134 may communicate with the storage elements 140 via a plurality of channels, such as channels CH0, CH1, . . . , CHn, as shown in FIG. 1.

Controller 130 may also comprise a RAM interface (not shown) for communication with the RAM 150 external to the controller 130. Host interface 132 in controller 130 may comprise a Serial Advanced Technology Attachment (SATA) connector or a NVMe™ connector (NVMe™ is an acronym for "NVM express," where "NVM" stands for "nonvolatile memory") operating with a PCIe™ ("Peripheral Component Interface Express") bus, for example. Interface 134 may comprise an Open NAND Flash Interface (ONFI) or a manufacturer's proprietary interface, for example. The interface that communicates with the external RAM may comprise, for example, an interface according to, but not limited to: a Double Data Rate (DDR) memory bus standard such as DDR3, DDR4 or DDR5; a Low Power Double Data rate (LPDDR) memory bus standard such as LPDDR3, LPDDR4 or LPDDR5; a Hybrid Memory Cube (HMC) memory bus standard.

As shown in FIG. 1, the controller 130 may comprise a flash translation layer 160 that enables the controller 130 to perform various functions that facilitate the processing of read and write requests from the host 110. The controller 130 may also include a read-only memory (ROM) 170 which stores instructions for management of the controller functions, such as the allocation of payload data to the storage elements 140, as will be detailed in the following description. ROM 170 stores such instructions in the form of firmware 172, which is programmable. This allows the operation of the memory controller 130 to be updated periodically throughout the lifespan of the SSD 120. The firmware 172 takes into consideration the change of characteristics (such as BER) of the storage elements 140 during their lifespan so as to optimize performance of the SSD 120. Such characteristics include the BER of the NAND devices which then determines the coderate (the ratio between the information data bits and the total number of bits, including ECC bits, in a codeword), the length of the ECC and parity codes (e.g. cyclic redundancy check (CRC) parity codes), the data frame size and the codeword size of the NAND devices 141-143 that make up the storage elements 140. The characteristics of the NAND devices, such as the BER, may change over time, temperature or number of Program/Erase (P/E) cycles and so the firmware 172 enables the controller 130 to tailor its operation in accordance with the age, temperature or number of P/E cycles of the NAND devices 141-143. The controller 130 may also store metadata in the NAND devices 141-143, some of which may be vital metadata which requires much better data protection than ordinary metadata (which may still require better protection than payload data from the host 110). Therefore the firmware 172 enables the controller 130 to tailor its operation in accordance with the type of data, payload data and metadata, as well as the age, temperature or number of P/E cycles of NAND devices 141-143.

The flash translation layer 160 may comprise a look-up table 162 that maps a logical address of the payload data received from the host 110 to a physical address within any of the NAND devices 141-143. In certain embodiments, the logical address may comprise a logical cluster address (LCA), and the physical address may comprise a media cluster address (MCA). Thus look-up table 162 maps the LCA of a payload to an MCA in the storage element 140. The flash translation layer 160 may also comprise a codeword offset module 164. The codeword offset module 164 is a code-dependent construct that is created by the firmware 172 on bootup of the SSD 120 to manage the payload stored in codewords in the NAND devices 141-143. Based on the characteristics of the NAND devices 141-143, such as the coderate, the firmware 172 performs calculations to determine the offset within each codeword at which the start of payload data is stored. In some embodiments, the firmware 172 creates a codeword offset look-up table 166 based on the coderate of each wordline in the NAND devices 141-143. In some embodiments, the coderate of each wordline, or each memory page in a wordline, in the NAND devices 141-143 may be stored in a configuration file 167. The flash translation layer 160 may also comprise an assembly module 168. The assembly module 168 is a code-dependent construct that is created by the firmware 172 that assembles the data transferred from the storage elements 140 to the host 110. Here the assembly module 168 assembles the payload sections prior to transferring the complete payload to the host 110 when the SSD processes a read request from the host 110.

Additionally, the controller 130 may include a local memory 180, such as a static random access memory (SRAM), that is internal to the memory controller 130. As with the DRAM 150, the SRAM 180 may also comprises several buffers that may be utilized by the flash translation layer 160 of the controller 130 during operation. According to embodiments of the present disclosure, the SRAM 180 may store a look-up table 182, such as a payload spill boundary table, that enables the controller 130 to manage the allocation of data to and from the codewords stored in the NAND devices 141-143. In some embodiments, the payload spill boundary table informs the controller 130 of the position within each codeword at which the payload data begins.

The controller 130 may include a feeder module 192 that is communicatively coupled to the host interface 132 for writing data received from the host 110 into codewords in the NAND devices 141-143. The feeder module 192 pushes the write data towards the codewords in the NAND devices 141-143, and does not have the bandwidth to perform detailed, sometimes recursive, calculations. The feeder module 192 forms part of the fast path of the write sequence as will be detailed in the following description. The controller 130 may also include a consumer module 194 that is communicatively coupled to the NAND interface 134 for allocating the write data to codewords for storage in the NAND devices 141-143. The consumer module 194 directs the feeder module 192 to write the data received from the host 110 to the codewords in the NAND devices 141-143. The consumer module 194 performs detailed calculations to determine the positions within each codeword at which data should be stored. The consumer module 194 is a slower module when compared to the feeder module 192, and sits outside the fast path. The feeder module 192 and the consumer module 194 together create a push-pull model for writing data to the NAND devices 141-143.

Figure 2:
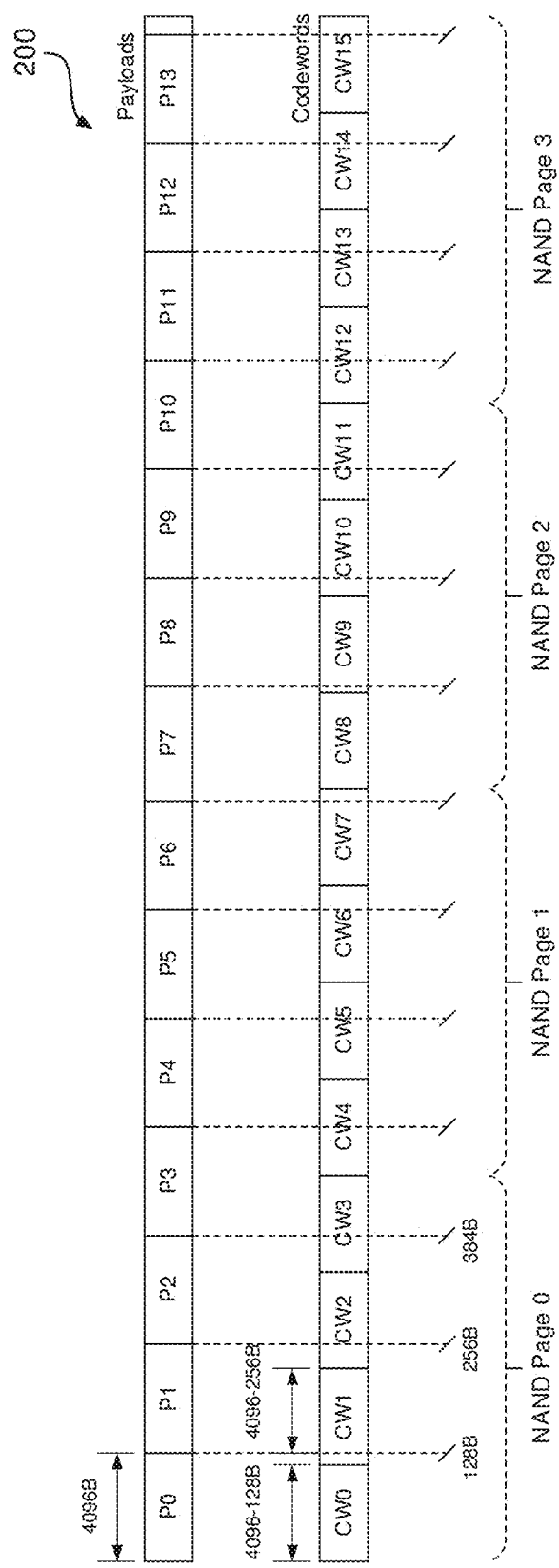
FIG. 2 illustrates the storage of data payloads in codewords of a nonvolatile semiconductor storage device, according to one or more embodiments of the present disclosure.

FIG. 2 illustrates data 200 stored in a NAND device, such as NAND devices 141-143 in FIG. 1. Data 200 has been received from host 110 in a write process as will be described below. FIG. 2 shows the data represented as plurality of payloads P0-P13 that are stored in a plurality of codewords CW0-CW15 of a wordline in the NAND device. It should be noted that only the data storage portions of the codeword are shown in FIG. 2. Other peripheral bits for ECC, parity, metadata and headers are not shown in codewords CW0-CW15. However upon read out of the data, these peripheral bits will be employed to perform error correction, RAID reconstruction, and other activities necessary to reconstruct the payload sections from the codewords in the codeword offset module 164, whereupon the assembly module 168 reconstructs the complete payloads from the payload sections. The ECC bits in codewords CW0-CW15 are not shown. Codewords CW0-CW15 are stored on four NAND pages, NAND Page 0 to NAND Page 3, where each NAND page comprises four codewords. For example in FIG. 2, NAND Page 0 comprises codewords CW0-CW3, NAND Page 1 comprises codewords CW4-CW7, NAND Page 2 comprises codewords CW8-CW11, and NAND Page 3 comprises codewords CW12-CW15. The NAND Pages 0-3 in FIG. 2 are good NAND pages in that the NAND devices 141-143 that make up NAND Pages 0-3 are all able to have data written to their codewords CW0-CW15.

Typically a NAND page is approximately 16 KB in size, and each NAND page is 4,096 bytes (about 4 KB) in size. If the BER of the NAND device is low, the ECC in each codeword could fit into the spare area of the page, and so an integer number of payloads would fit exactly into a corresponding codeword. However if the BER of the NAND device is high, the ECC in each codeword increases in size to the extent where the ECC bits in the codeword encroaches upon the space available for the storage of payload data. This means that the ECC bits take away some physical NAND space from the payload area thereby resulting in a smaller space available for the data to be stored. Effectively this means that the data size per codeword of the NAND device decreases. This can be seen in FIG. 2 where each of codewords CW0-CW15 have a smaller data size than the payloads P0-P13. In such a situation it would not be possible to fit an integer number of payloads into the page as the data for each page effectively spills over to at least the next adjacent codeword. The number of codewords from the start of the wordline is termed the codeword offset and the portion of a payload stored in the next adjacent codeword is termed the spill offset.

For example, as shown in FIG. 2, the payloads and codewords with an ECC code of payload size 4096 and codeword data size 4096-X (i.e. each codeword having 4096-X bytes of payload data and X bytes of ECC). In this example, payload P0 is stored in two codewords CW0-CW1, where the data in payload P0 is stored in all of codeword CW0 and a small portion of codeword CW1. Here the codeword offset for payload P0 is "0", and the spill offset is also 0 as the payload begins at the beginning of the codeword. Data for payload P1 is stored beginning in CW1, so its codeword offset is 1, but the start of the data is offset X bytes from the start of CW1 (since this is occupied by the tail X bytes from payload P0), therefore its spill offset is X. As another example, payload P7 in FIG. 2 is stored in three codewords CW7-CW9, where the data in payload P7 is stored in a portion of codeword CW7, all of codeword CW8, and a portion of codeword CW9. Here the codeword offset for payload P7 is codeword "7", and the payload then spills to codewords CW8 and CW9. The spill offset for P7 is 7×X. The spill offset for successive payloads increases by X bytes for each payload, until the point is reached where the start of the payload once again coincides with the start of the codeword, if the number X is chosen to divide the codeword (data+ECC) size by an integer multiple. If not, there will be some remainder less than X which may be left unoccupied by data, such that the next payload does coincide with the start of the codeword.

The amount of data from a payload that spills into the next adjacent codeword is dependent on by the coderate of the wordline in the NAND device. In some implementations, it may be dependent of the coderate of each individual page in the wordline. As an example, a typical wordline comprises 16 NAND pages, each page having four codewords, and so the wordline spans 64 codewords. For NAND devices having low BER (e.g. for new memories), a payload would be able to fit nicely within a codeword with the ECC bits in the spare area of the NAND page, i.e. a 1:1 mapping of payload to codeword, thus resulting in a coderate of 64/64 where 64 payloads fit into 64 codewords. However over time as the memory gets used, the BER increases necessitating an increased number of ECC bits in each codeword. This means less space for data to be stored in each codeword, causing the coderate to decrease. Exemplary reduced coderates are 63/64 where 63 payloads fit into 64 codewords, 62/64 where 62 payloads fit into 64 codewords, 60/64 where 60 payloads fit into 64 codewords, etc. This means the 1:1 mapping of payload to codeword now changes such that fewer payloads can fit into the codewords in a NAND page.

It should be noted that the underlying number of codewords is fixed in each NAND device, for example 64 in the aforementioned examples, however depending on the amount of ECC needed, it reduces the capability of the NAND device to store an equivalent number of payloads. Thus as the coderate decreases, a portion of each payload spills over to the next adjacent codeword. As an example, in FIG. 2, a main portion of payload P0 comprising 4,096 bytes−128 bytes has a codeword offset of "0", and a remaining portion of payload P0 comprising 128 bytes that is spilled over and stored in the next adjacent codeword CW1. As a further example, in FIG. 2, a main portion of payload P1 comprising 4,096 bytes-2×128 bytes has a codeword offset of "1", and a remaining portion of payload P1 comprising 2×128 bytes is spilled over and stored in the next adjacent codeword CW2. In FIG. 2, it can be seen that the amount of data that is spilled over to the next adjacent codeword increases down the wordline as the codeword offset increases. In some instances, the payload may be spread over 3 adjacent codewords, with N bytes (say) in the first codeword, (4,096-128) bytes in the second codeword and (128-N) bytes in the third codeword.

Figure 3:
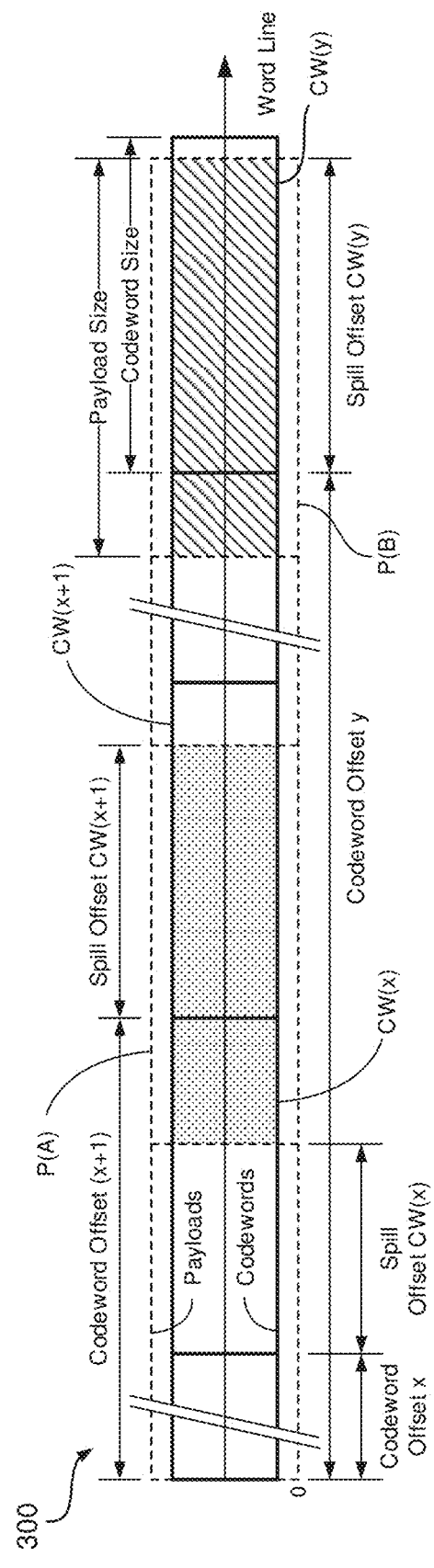
FIG. 3 illustrates general features in the storage of data payloads in codewords of a nonvolatile semiconductor storage device, according to one or more embodiments of the present disclosure.

The codeword offset and the spill offset are managed by the firmware 172 and the controller 130 such that when the SSD 120 receives a read request for data from a particular payload, the controller manages the read request and fetches a main portion and a remaining portion(s) of the requested payload from the appropriate codeword. FIG. 3 illustrates data 300 stored in a NAND device. In FIG. 3 the payloads that have been overlaid on the codewords of a wordline. As described in the foregoing, the codeword offset is a measure of the number of codewords from the start of the wordline, and indicates the codeword at which a payload begins. For example, the codeword offset x indicates that a payload, such as payload P(A), begins in codeword CW(x), the codeword offset measured from codeword zero along the wordline. As coderates in the NAND device decrease, the ratio of the number of payloads that can fit into the number of codewords along a wordline is less than 1:1. To cater to this mismatch, there exists a spill offset for each codeword. For codeword CW(x), the spill offset is a point within the codeword CW(x) at which the payload begins, as depicted in FIG. 3. The spill offset is measured in bytes. It therefore follows that each codeword has an associated spill offset, and the size of the spill offset is dependent on the coderate.

When a payload is stored in the NAND device, the data contained in the payload is fit into a plurality adjacent codewords. The apportionment of a payload across the plurality of adjacent codewords is within the scope of the present disclosure. It should be noted that the 'adjacent' nature of the codeword refers to the logical address of the codeword. Thus two codewords are deemed to be adjacent if their logical addresses are in sequential order, i.e. one after another, even though the codewords may be located on different page, blocks, planes and/or dies of the NAND device. For example in FIG. 3, payload P(A) spans codeword CW(x) and codeword CW(x+1), where codeword CW(x+1) is the next adjacent codeword to codeword CW(x). Note that codewords CW(x) and CW(x+1) may be on the same wordline, or they may be on different wordlines, pages, blocks, planes and/or dies of the NAND device, however the logical addresses for codeword CW(x) and CW(x+1) are sequential. As shown in FIG. 3, a main portion of payload P(A) is stored in codeword CW(x) and a remaining portion of payload P(A) is stored in the next adjacent codeword CW(x+1). Here the data in the main portion of payload P(A) is stored in codeword CW(x), from the spill offset of codeword CW(x) to the end of codeword CW(x), and the data in the remaining portion of P(A) is stored in the next adjacent codeword CW(x+1), from the start of codeword CW(x+1) to the spill offset of codeword CW(x+1). Similarly, the data in the main portion of payload P(B) in FIG. 3 is stored in codeword CW(y−1), from the spill offset of codeword CW(y−1) to the end of codeword CW(y−1), and the data in the remaining portion of P(B) is stored in the next adjacent codeword CW(y), from the start of codeword CW(y) to the spill offset of codeword CW(y).

As seen in FIG. 3, the remaining portion of a payload always spills to the next adjacent payload. Thus, when the firmware processes a read request from the host, once the main portion of a payload is located in a particular codeword in the NAND device, the remaining portion of that payload will be in the next adjacent codeword. As mentioned in the foregoing, the 'adjacent' nature of the codeword refers to the logical address of the codeword. Thus two codewords are deemed to be adjacent if their logical addresses are in sequential order along a wordline, i.e. one after another. In the case of the last codeword in a wordline, the next adjacent codeword may be at the start of the next wordline which may be in the same physical block, or in a different physical block, plane and/or die of the NAND device.

Referring to FIG. 3, the very last codeword for the wordline is codeword CW(y). According to an embodiment of the present disclosure, the remaining portions of payloads continue to spill to the next adjacent codeword until the end of the wordline. Thus the portion of codeword CW(y), from the spill offset of codeword CW(y) to the end of codeword CW(y) remains unused. The next payload following payload P(B) is stored in codewords on the next wordline. For example if the wordline in FIG. 3 is wordline seven in the NAND device, when the codewords on wordline seven are all filled with data, the firmware increments to wordline eight and starts storing data in the codewords of wordline eight. There are several reasons for this, one of which is that each wordline has a unique parity code, and thus it simplifies generating an overall parity in the firmware for data stored in codewords on the same wordline (i.e. no payloads spill from a codeword on one wordline to a codeword on the next). Another reason for this is the BER may differ from one wordline to another, and thus the coderate may not be the same for each wordline. In this manner the present disclosure minimizes the wastage of space in the NAND device as the codewords on each wordline are filed sequentially until the very last codeword. Only the portion of the very last codeword on the wordline is wasted. This is a considerable reduction in wasted space compared to moving to a new codeword after each payload. Thus the wastage of space according to embodiments of the present disclosure is per wordline and not per payload/codeword, which is a marked reduction.

As the present disclosure is reliant on the sequence of logical addresses of the codewords, i.e. the logical address of codeword CW(x) and the next logical address of codeword CW(x+1), the spill offset for each codeword follows in the order in which the payloads were stored in the NAND devices. Thus if data has been written from a the lower NAND page, to the middle NAND page, to the upper NAND page, the spill offset within each page will follow suit in the same sequence. This allows for better usage of the NAND device my minimizing wastage of space within a page.

When the SSD 120 boots up, the controller 130 and firmware 172 may perform several calculations to determine the spill offset for each codeword. Parameters such as the payload size PL and the coderate CR are stored in the configuration file 167 which is read by the firmware 172 on boot up. The firmware 172 then determines the codeword size CW_Size and the spill per codeword Spill_per_CW by:

$$CW\_Size = PL \times CR = PL \times (\text{No. of Payloads} \div \text{No. of Codewords}) \quad (1)$$

$$Spill\_per\_CW = PL - CW\_Size \quad (2)$$

For example, for a coderate of 62/64 and a payload size of approximately 4 KB (specifically 4,096 bytes), the codeword size is 3,968 bytes and the spill offset per codeword is 128 bytes. As another example, a coderate of 60/64 and a payload of 4 KB would result in a codeword size of 3,840 bytes and a spill offset per codeword of 256 bytes.

In order to read a payload from multiple codewords in the NAND devices, the firmware 172 determines the portion (e.g. the main portion or the remaining portion) of the payload on each codeword. In order to do so, the firmware 172 determines the size of the payload on each codeword and the spill offset within the codeword from where to read the payload data. Here the firmware 172 calculates the total accumulated spill Total Spill at a codeword offset CW_Offset, and the spill offset Spill_Offset by:

$$Total\_Spill = CW\_Offset \times Spill\_per\_CW \quad (3)$$

$$Spill\_Offset = Total\_Spill \ \% \ CW\_Size \quad (4)$$

where % is a modulo operator which returns the remainder of a division, i.e. the spill offset is the remainder from the division of the total accumulated spill by the codeword size.

As an example, assuming a coderate of 62/64, if a read request contains LCA information that points to the payload P10 stored in codeword CW11, using equation (1) the codeword size is 4,096×62/64=3,840 bytes, using equation (2) the spill per codeword is 4,096−3,840=128 bytes, using equation (3) the total spill is 11×128=1,408 bytes, and using equation (4) the spill offset is 1,408% 3,840=1,408 bytes. Using similar calculations, the spill offset for the next adjacent codeword CW12 is 1,536 bytes. This means that the main portion of requested payload P10 is located at 1,408 bytes from the start of codeword CW11 to the end of codeword CW11, and the remaining portion of the payload P10 is located in the first 1,536 bytes of the next adjacent codeword CW12.

The firmware 172 performs calculations using equations (1) to (4) repeatedly for each codeword to determine the associated spill offset so that the correct read data requested by the host 110 can be retrieved from the NAND devices 141-143 by the controller 130. However such repeated calculations are compute intensive and will put a burden on the processors of the SSD 120. The present disclosure includes the implementation of a payload spill boundary look-up table 182 that is created by the firmware 172 when the SSD 120 first initializes and boots up. The payload spill boundary look-up table 182 comprises spill offset values for each codeword offset which has been calculated using equations (1) to (4) for a specific coderate. These values are stored in the SRAM 180 of the controller 130. An exemplary payload spill boundary look-up table 182 is shown in Table 1. As can be seen the spill offset values loop after a total spill that is equivalent to the size of the payload of 4,096 bytes, i.e. the spill offset values loop back to 128 bytes after 32 codewords. By indexing into the payload spill boundary look-up table 182, the controller is able to process a read request from the host 110 quickly.

As previously mentioned, the coderate may not be the same across all the wordlines in the NAND devices 141-143. The reliability and the BER of each wordline in a NAND memory may differ from one page to another. Some wordlines may require more error correction compared to others. Such wordlines may be able to fit fewer data payloads than wordlines requiring less error correction. For example, memories where less than 10% of the wordlines exhibit high BER while the remaining 90% of the wordlines are healthy enough for a 1:1 mapping, the firmware will end up setting all wordlines as a short data frame to cater to the high ECC required by the worlines exhibiting high BER. In such a situation, the loss of performance is dictated by the wordlines with the highest BER. Thus according to some embodiments of the present disclosure the firmware 172 may create a payload spill boundary look-up table 182 for each coderate in the NAND devices 141-143 thus giving rise to a plurality of payload spill boundary look-up tables 182 which are stored in the SRAM 180. In further embodiments of the present disclosure, the controller 130 may measure the coderate of each of the word lines in the NAND devices 141-143 on boot up of the SSD 120 and write the measured coderates to the configuration file 167 for the creation of the payload spill boundary look-up tables 182.

Figure 8:
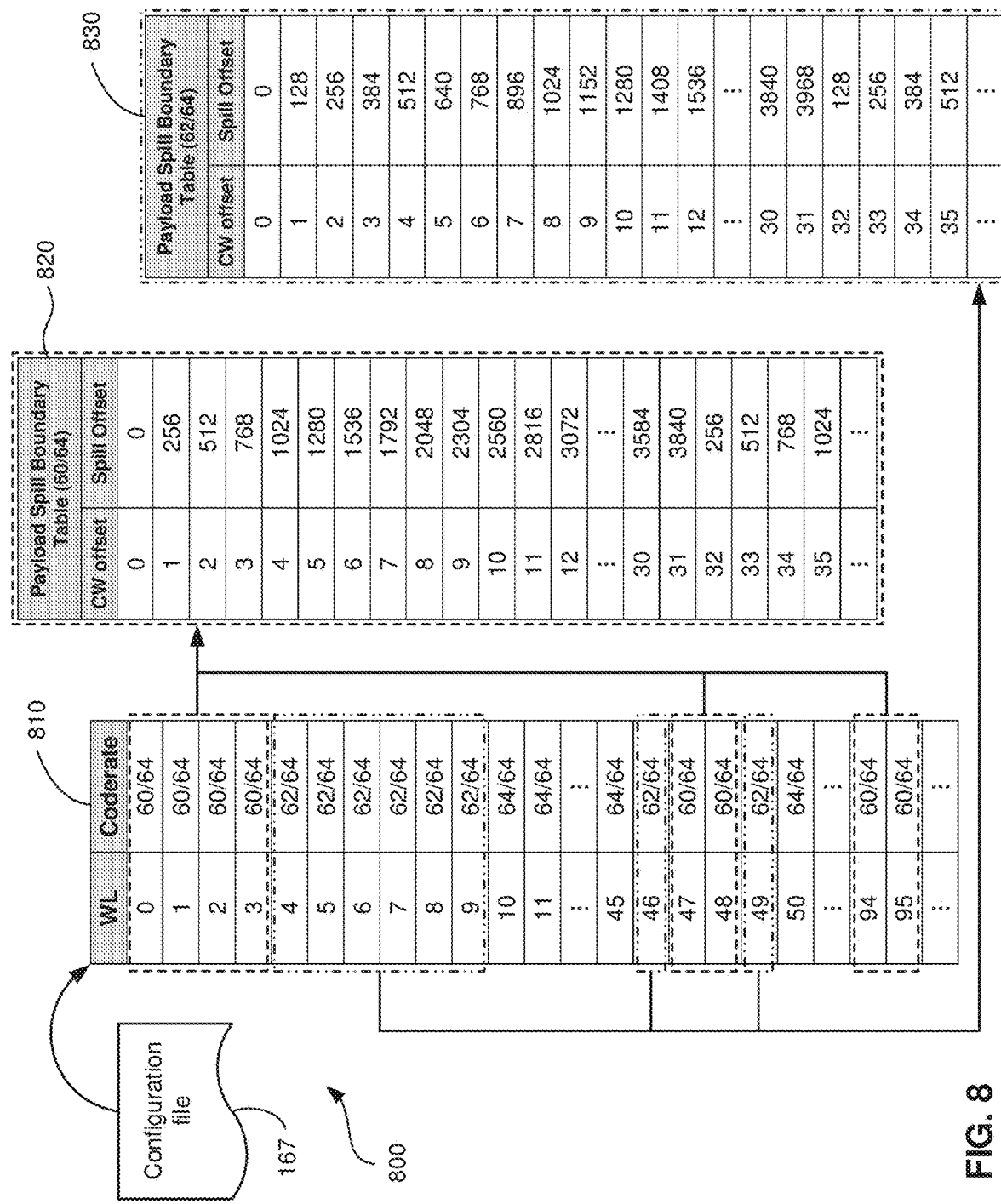
FIG. 8 illustrates an example of a wordline to coderate mapping table, according to one or more embodiments of the present disclosure.

FIG. 8 illustrates the composition 800 of the configuration file 167 as shown in FIG. 1, according to an embodiment of the present disclosure. The configuration file 167 may contain a wordline-to-coderate mapping table 810. During read and write operations, the CW Offset Module 164 indexes the wordline-to-coderate mapping table 810 and obtains a pointer to a payload spill boundary table 820, 830 appropriate for the coderate associated with the wordline. For example, in table 810, wordlines 0-3, 47, 48, 94 and 95 refer to a coderate 60/64, and the entries in table 810 that correspond to those wordlines contain a pointer to Payload Spill Boundary Table (60/64) 820. As another example, in table 810, wordlines 4-9, 46 and 49 refer to a coderate 62/64, and the entries in table 810 that correspond to those wordlines contain a pointer to Payload Spill Boundary Table (62/64) 830. The present disclosure therefore provides a common, flexible and customizable infrastructure that allows for changes in the coderate of the NAND devices 141-143 to be easily implemented during initialization of the SSD 120 without having to reprogram the firmware 172.

TABLE 1

Exemplary Payload Spill Boundary Look-Up Table
Payload Spill Boundary Table (62/64)

| Codeword Offset | Spill Offset (B) |
|---|---|
| 0 | 0 |
| 1 | 128 |
| 2 | 256 |
| 3 | 384 |
| 4 | 512 |
| 5 | 640 |
| 6 | 768 |
| 7 | 896 |
| 8 | 1024 |
| 9 | 1152 |
| 10 | 1280 |
| 11 | 1408 |
| 12 | 1536 |
| . | . |
| . | . |
| . | . |
| 30 | 3840 |
| 31 | 3968 |
| 32 | 128 |
| 33 | 256 |
| 34 | 384 |
| 35 | 512 |
| . | . |
| . | . |
| . | . |

Figure 4:
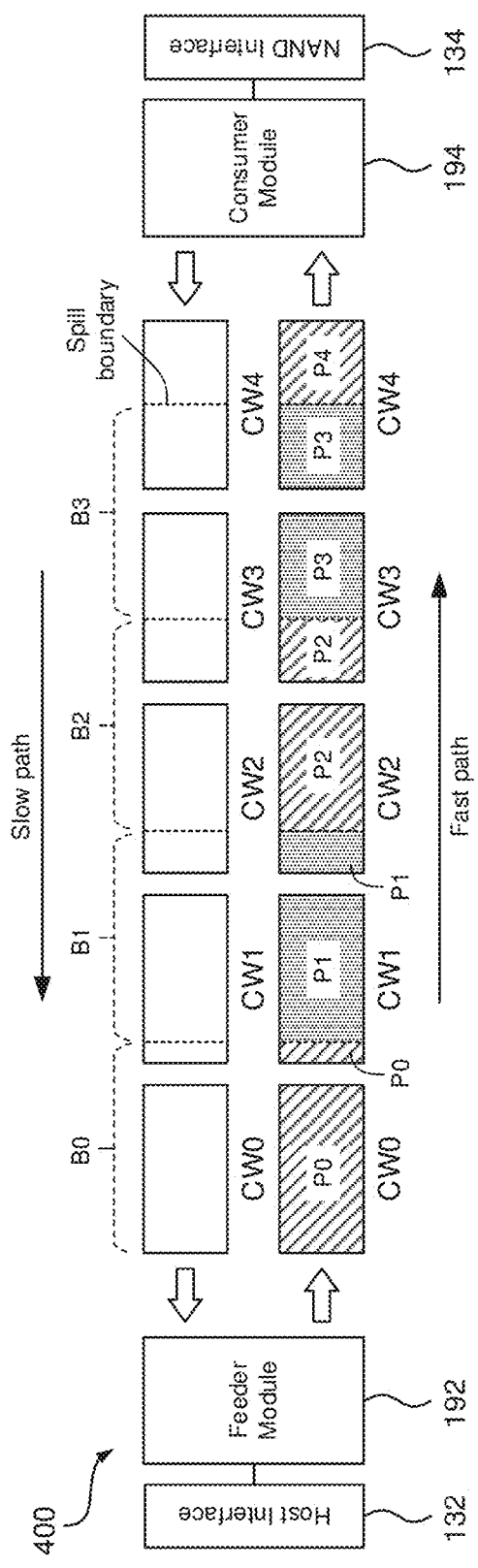
FIG. 4 illustrates a the storage of data payloads in codewords of a nonvolatile semiconductor storage device using a feeder module and a consumer module, according to one or more embodiments of the present disclosure.

FIG. 4 illustrates the push-pull model created by the feeder module 192 and the consumer module 194 of the controller 130 to manage writing data to the codewords of the NAND devices 141-143 during a write sequence. As previously mentioned, the feeder module 192 is communicatively coupled to the host interface 132, and the consumer module 194 is communicatively coupled to the NAND interface 134. The consumer module 194 has information about the NAND devices 141-143 such as the code rate at each wordline and the spill boundary of each codeword. The consumer module 194 effectively creates 'empty buckets' within the codewords of the NAND devices 141-143. These 'empty buckets' relay information to the feeder module 192 so that the feeder module 192 knows the codeword in which to start writing data, and how much data to write to the codeword within the boundaries of each 'empty bucket'. Such boundaries are defined by the MCA of the start of the codeword, the MCA of the spill offset of the codeword, and the MCA of the end of the codeword. In this manner, the consumer module 194 essentially abstracts specific information about the codewords of the NAND devices 141-143 (such as code rate, codeword size, payload size, spill boundary, etc.).

This simplifies the operation of the feeder module 192, which essentially writes to the codewords by filling up each 'empty bucket' created by the consumer module 194 without requiring any details about the NAND devices 141-143 (such as code rate, codeword size, payload size, spill boundary, etc.) of the associated codewords. The feeder module 192 can therefore operate at a much faster rate than the consumer module 194. Further, as the information about the NAND devices 141-143 is abstracted in the consumer module 194, when the code rates of the NAND devices 141-143 change, the controller 130 simply needs to update the information contained within the consumer module 194 (via the configuration file 167, for example) to adjust the operation of the SSD 120 in accordance with the new code rate.

The consumer module 194 therefore knows which codeword will be written to next when processing a sequence of write requests from the host 110, generates information about that next codeword, and loads the information into the feeder module 192 via an 'empty bucket'. The feeder module 192 then uses this information to i.e. write, as much write data as possible into the 'empty bucket' and sends it back to the consumer module 194 which then updates the LCA associated with the write data. In some embodiments, the consumer module 194 may describe each 'empty bucket' with a bitmap associated with each codeword that is read in by the feeder module 192.

FIG. 4 illustrates the operation of the controller 130 when processing an exemplary write request received from the host 110. The consumer module 194 assess the size of the write data and determines the codewords CW0-CW4 in NAND devices 141-143 are available for storing the write data. It then determines the codeword size and the spill boundary associated with each codeword. In some embodiments, the controller 130 indexes into the payload spill boundary look-up table 182 stored in the SRAM 180 of the SSD 120 to obtain the spill boundary for each codeword, as described above. The consumer module then creates 'empty bucket' constructs B0-B3 within codewords CW0-CW4, as illustrated in FIG. 4. Essentially each of B0-B3 delimit the space within each codeword CW0-CW4 in which write data is to be written. When forming the empty buckets the consumer module 194 abstracts information from the NAND devices 141-143 and relies on the controller 130 to calculate (or determine using a look-up table) the spill boundary for each codeword. The formation of empty buckets by the consumer module 194 for the feeder module 192 during the processing of a write request forms a slow path as indicated in FIG. 4.

For example in FIG. 4 the consumer module 194 creates empty bucket B0 that spans all of codeword CW0, and a portion of codeword CW1 (from the start of the codeword to its spill boundary). Similarly, the consumer module 194 creates empty bucket B1 that spans a portion of codeword CW1 (from its spill boundary to the end of the codeword), and a portion of codeword CW2 (from the start of the codeword to its spill boundary). The consumer module 194 also creates empty bucket B2 that spans a portion of codeword CW2 (from its spill boundary to the end of the codeword), and a portion of codeword CW3 (from the start of the codeword to its spill boundary). Further, the consumer module 194 creates empty bucket B3 that spans a portion of codeword CW3 (from its spill boundary to the end of the codeword), and a portion of codeword CW4 (from the start of the codeword to its spill boundary). The information defining the boundaries of each empty bucket B0-B3 is stored in a bitmap in each codeword CW0-CW4.

Upon receipt of empty buckets B0-B3, the feeder module 192 reads the bitmap in each codeword CW0-CW4 and fills each empty bucket with the payload of the write data. For example, the feeder module 192 fills empty bucket B0 with payload P0, empty bucket B1 with payload P1, empty bucket B2 with payload P2, and empty bucket B3 with payload P3. Unlike the consumer module 194, the feeder module 192 does not perform any calculations to determine the codeword size or spill boundary of each codeword CW0-CW4. It simply uses the bitmap and fills the available space in each codeword delineated by the bitmap with the write data. The filling of empty buckets by the feeder module 192 during the processing of a write request forms a fast path as indicated in FIG. 4. As mentioned in the above description, when the feeder module 192 'fills' an empty bucket, it is actually writing the payload data to the respective codewords. In preparing empty buckets for the feeder module 192, the consumer module 194 looks ahead at the availability of codewords within the NAND devices 141-143 and prepares the empty buckets for receiving write data from the feeder module 192 accordingly. This simplifies the operation of the feeder module 192 which only has to fill the buckets with write data.

Figure 5:
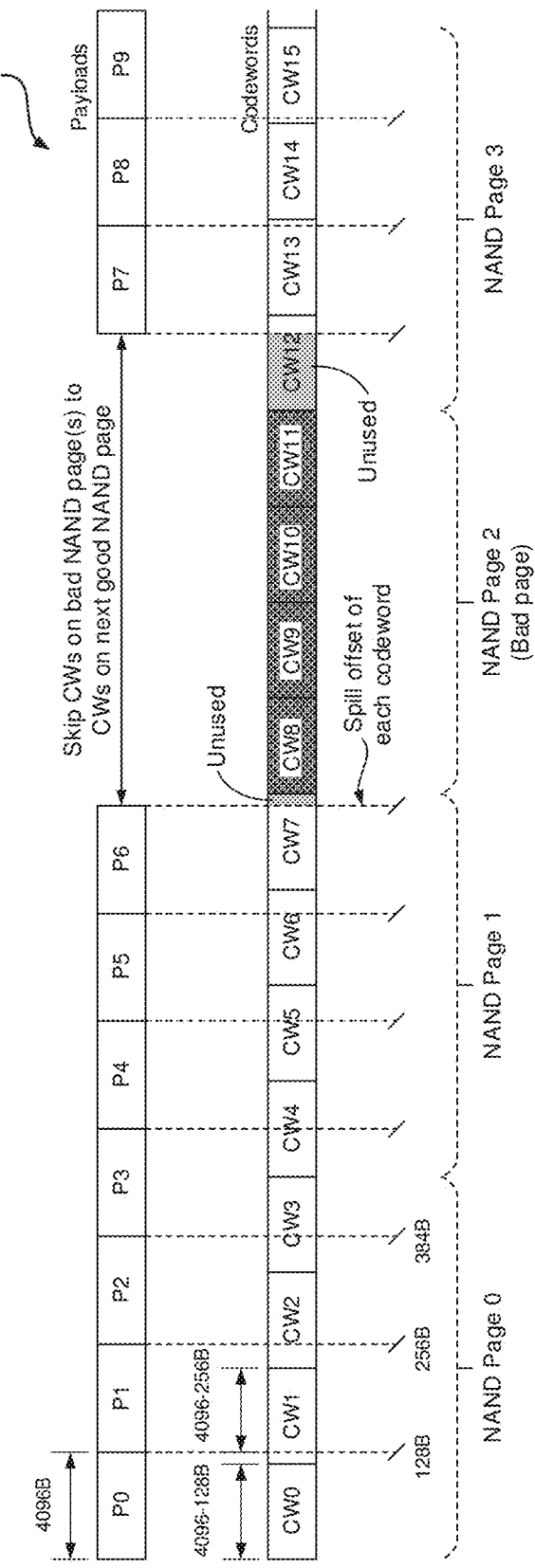
FIG. 5 illustrates the storage of data payloads in codewords of a nonvolatile semiconductor storage device with a bad page, according to one or more embodiments of the present disclosure.

An application of the push-pull model created by the feeder module 192 and the consumer module 194 of the controller 130 is to detect bad pages in the NAND devices 141-143 so as to avoid such pages when processing a write request, thereby improving the integrity of the SSD 120 when it comes to reading back the stored data. FIG. 5 shows the storage of data 500 in a NAND device, such as NAND devices 141-143 in FIG. 1. The storage of data 500 in FIG. 5 is similar to the storage of data 200 in FIG. 2, with the exception that not all of the NAND pages in FIG. 5 are good. This may happen on a wordline where a bad NAND page is encountered preventing any data being written to codewords on that page. In FIG. 5 NAND Page 2 is a bad page and so the memory 140 loses codewords CW8-CW11 as they cannot be written to. Notwithstanding, according to embodiments of the present disclosure, the push-pull model created by the feeder module 192 and the consumer module 194 enables an SSD 120 with at least one bad NAND page to process a write request received from a host 110 without complicating the write sequence, and maintaining the integrity of the stored data during read back.

For example, as shown in FIG. 5, payload P6 is stored in two codewords CW6 and CW7. Specifically, a first portion of payload P6 is stored in codeword CW6, from the spill offset of codeword CW6 to the end of codeword CW6, and a remaining portion of payload P6 is stored in the next adjacent codeword CW7, from the start of codeword CW7 to the spill offset of codeword CW7. The next payload P7 should be stored in codewords CW7 and CW8. However in this case, codewords CW8-CW11 are on a bad NAND page, and so these codewords cannot be used for the storage of data. According to embodiments of the present disclosure, the consumer module 194 identifies a codeword as being on a bad NAND page via the bitmaps generated for each codeword. Thus when the feeder module 192 reads in a bitmap for a codeword, it will know not to write data to a codeword belonging to a bad NAND page. Thus in this case the next payload P7 is stored on the next good NAND page. The next good page is NAND Page 3 comprising codewords CW12-CW15. Thus payload P7 is stored in codewords CW12 and CW13. Specifically, a main portion of payload P7 is stored in codeword CW12, from the spill offset of codeword CW12 to the end of codeword CW12, and a remaining portion of P7 is stored in the next adjacent codeword CW13, from the start of codeword CW13 to the spill offset of codeword CW13.

It should be noted that the first portion of payload P7 is not stored in codeword CW7 (from the spill offset of codeword CW7 to the end of the codeword) as that would mean that the remaining portion of the payload P7 would have to be stored in codeword CW12, which is not a codeword adjacent to codeword CW7. Writing the payload P7 in such a manner would create a problem when reading back the data as there would be a mismatch between the codeword offset and the spill offset, which would require additional checks when reading back the data leading to added complexity. According to embodiments of the present disclosure the remaining space in codeword CW7 remains unused, codewords CW8-CW11 are skipped as they are on bad NAND Page 2, and the next payload P7 is stored in a new codeword CW12 on the next good NAND Page 3. As discussed in the foregoing, when a new codeword is used, data is stored from the spill offset of that codeword onwards.

The foresight of looking ahead and determining if the next adjacent codeword is on a good or bad NAND page is provided by the by the push-pull model created by the feeder module 192 and the consumer module 194 of the controller 130, and the bitmaps generated for each codeword, as will be detailed in the description below.

Figure 6:
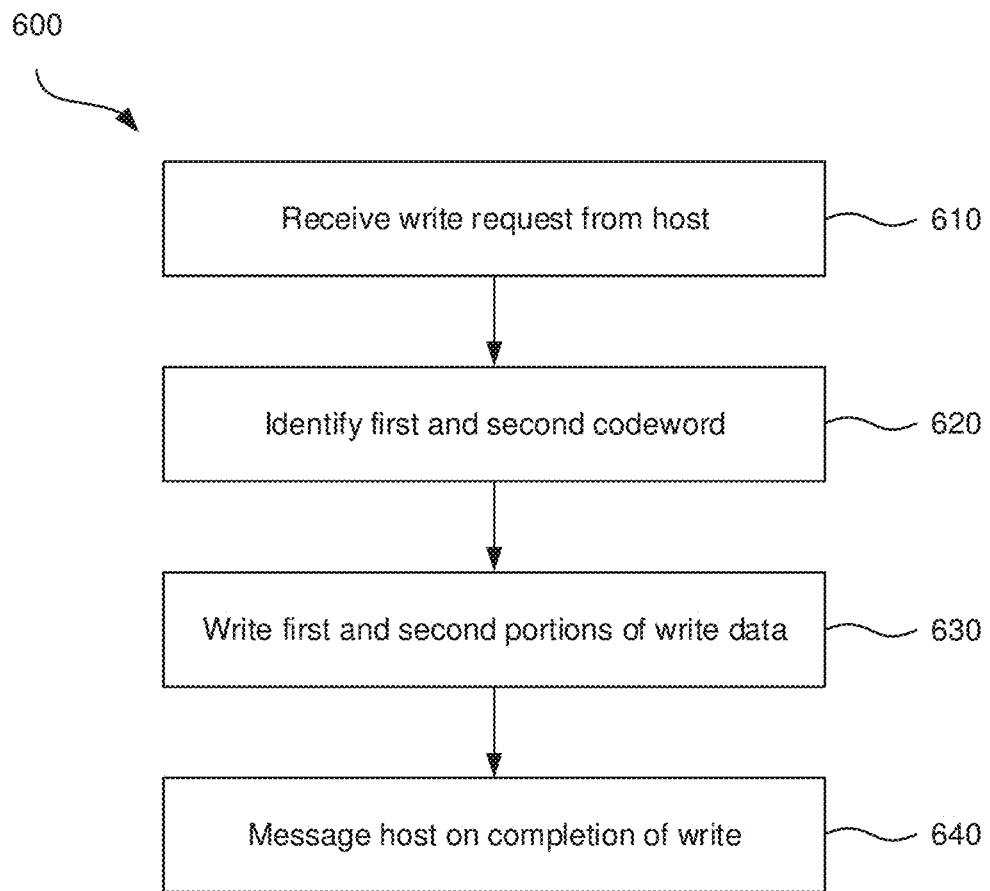
FIG. 6 is a flow diagram of a first method for processing a write request from a host according to one or more embodiments of the present disclosure.

FIG. 6 illustrates an exemplary flow diagram of a method 500 for processing a write request from the host 110 according to an embodiment of the present disclosure. The method begins at step 610 where controller 130 receives a write request from the host 110 via the host interface 132. The write request contains write data in the form of at least one payload having a payload size PL. In some embodiments, upon receipt of the write request, the consumer module 194 of the controller 130 determines which of the NAND devices 141-143 in the memory 140 is available to store the payload of write data, and assigns an MCA of the available NAND device to the write request.

Once a suitable NAND device is identified, the controller 130 obtains a codeword offset CW_Offset from a codeword offset module 164 using the assigned MCA (step 620). Here the controller uses the assigned MCA to index into a look-up table 166 that maps each MCA in the memory 140 to the codeword offset along the respective wordlines in the NAND devices 141-143. As discussed in the foregoing, the codeword offset is a measure of the number of codewords from the start of a wordline at which the codeword containing the data begins. Once the codeword offset for the write payload is obtained, codeword offset x, for example, the controller may calculate the spill offset Spill_Offset for codeword CW(x) at codeword offset x using equations (1) to (4). In some embodiments, the firmware 172 uses the codeword offset x to index into a payload spill boundary look-up table 182 (such as the look-up table in Table 1) stored in the SRAM 180 of the controller 130 to obtain the spill offset in codeword CW(x). The controller 130 also obtains the spill offset of the next adjacent codeword CW(x+1).

In step 630, controller 130 uses the codeword offset 'x' and the associated spill offset to write a first portion of the payload to the codeword CW(x). Here the first portion of the payload is written from the spill offset of the codeword CW(x) to the end of the codeword CW(x). The controller 130 then determines if there is a remaining portion of the payload and, if so, writes the remaining portion of the payload (i.e. spilled data) to the next adjacent codeword CW(x+1), from the start of the next adjacent codeword CW(x+1) to the spill offset of the next adjacent codeword CW(x+1). In some embodiments, the consumer module 194 in the controller 130 uses the codeword offset 'x' and the associated spill offset to generate an empty bucket identified by a bitmap. The bitmap may also contain information for the next adjacent codeword having a codeword offset 'x+1'. The feeder module 192 then reads the bitmap and fills the empty bucket by writing the payload to the codeword CW(x), and CW(x+1) where there is spilled data, using the information contained in the bitmap. The controller 130 then updates the LCA to MCA look-up table 162 so as to set a pointer to codeword CW(x) in which the write data begins.

Once all the write data has been written to the codewords in the memory 140, the controller 130 sends a message to the host 110 to inform the host of completion of the write request (step 640). In certain embodiments, the message may contain the LCA that corresponds to the position within the memory 140 at which the write data starts.

As an example of processing a write request according to method 600, when the SSD 120 receives a write request with write data comprising payload P5 as shown in FIG. 5 from host 110 (step 610), the consumer module 194 identifies the codeword CW5 for storing the first portion of the payload P5, and the next adjacent codeword CW6 for storing the remaining portion of the write data payload P5 (step 620). The consumer module 192 also either calculates using equations (1) to (4) or indexes into the payload spill boundary table 182 to determine the spill offset associated with each of codewords CW5 and CW6. The feeder module 192 then writes the first portion of payload P5 to codeword CW5, from the spill offset of the codeword to the end of the codeword (step 630). The feeder module 192 also writes the remaining portion of payload P5 to codeword CW6, from the start of the codeword to the spill offset of the codeword. In some embodiments, the feeder module 192 uses a bitmap as generated by the consumer module 194 to write the main and remaining portions of payload P5 to codewords CW5 and CW6. Once the payload P5 has been written to the memory 140, the controller 130 may send a message to the host 110 confirming completion of the write request (step 640).

Figure 7:
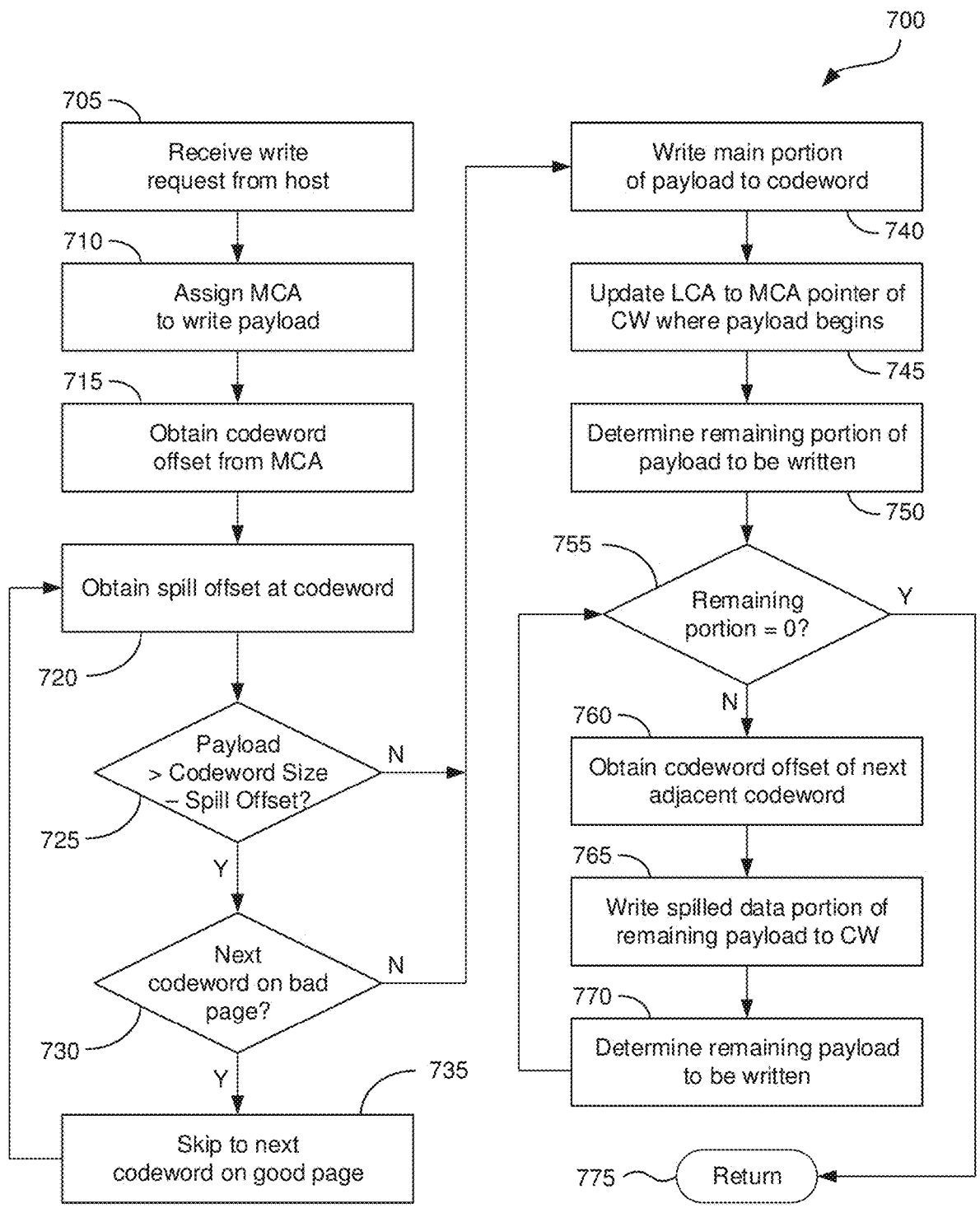
FIG. 7 is a flow diagram of a second method for processing a write request from a host according to one or more embodiments of the present disclosure.

FIG. 7 illustrates an exemplary flow diagram of a method 700 for processing a write request from the host 110 according to another embodiment of the present disclosure. The method begins at step 705 where controller 130 receives a write request from the host 110 via the host interface 132. The write request contains write data in the form of at least one payload having a payload size PL. Upon receipt of the write request, the consumer module 194 in the controller 130 determines which of the NAND devices 141-143 in the memory 140 is available to store the payload of write data, and assigns an MCA of the available NAND device to the write request (step 710).

Once a suitable NAND device is identified, the method 700 proceeds to step 715 where the controller 130 obtains a codeword offset CW_Offset from a codeword offset module 164 using the assigned MCA. Here the controller uses the assigned MCA to index into a look-up table 166 that maps each MCA in the memory 140 to the codeword offset along the respective wordlines in the NAND devices 141-143. As discussed in the foregoing, the codeword offset is a measure of the number of codewords from the start of a wordline at which the codeword containing the data begins. Once the codeword offset for the write payload is obtained, codeword offset 'x', for example, the controller calculates the spill offset Spill Offset for codeword CW(x) at codeword offset 'x' using equations (1) to (4) in step 720. In some embodiments, the firmware 172 uses the codeword offset 'x' to index into a payload spill boundary look-up table 182 (such as the look-up table in Table 1) stored in the SRAM 180 of the controller 130 to obtain the spill offset in codeword CW(x). The controller 130 also obtains the spill offset of the next adjacent codeword CW(x+1).

The method 700 then progresses to step 725 where the controller 130 determines if all the write data can be contained within the codeword CW(x), or if there is a portion that spills over to the next adjacent codeword CW(x+1). Here the consumer module 194 of the controller compares the payload size PL with the difference between the codeword size and the spill offset. If there is no write data that spills over to the next adjacent codeword (i.e. 'N' at step 725), the feeder module 192 of the controller 130 writes the write data payload to the codeword CW(x) from the spill boundary of the codeword to the end of the codeword in step 740. However if there is write data that spills over to the next adjacent codeword (i.e. 'Y' at step 725), the controller 130 determines if the next adjacent codeword CW(x+1) is located on a bad NAND page (step 730) before writing any of the write date to the NAND devices 141-143.

If the next adjacent codeword CW(x+1) is not located on a bad NAND page (i.e. 'N' at step 730), the feeder module 192 of the controller 130 writes a main portion of the write data payload to the codeword CW(x) from the spill boundary of the codeword to the end of the codeword (step 740). However if the next adjacent codeword CW(x+1) is located on a bad NAND page (i.e. 'Y' at step 730), the controller 130 skips to the next codeword on the next good page in step 735. Once the next codeword on the next good page is obtained, the method 700 loops back to step 720 where the controller 130 determines the spill offset at that codeword.

Once the main portion of the write data payload is written to the codeword (step 740), the method 700 progresses to step 745 where the controller 130 updates the LCA to MCA look-up table 162 so as to set a pointer to the codeword CW(x) in which the main portion of the write data begins. In step 750 the controller 130 determines the size of the write data payload that has spilled over to the next adjacent codeword CW(x+1). This write data payload that has spilled over to the next adjacent codeword CW(x+1) is the remaining portion of the write data payload. At step 755 the controller 130 checks if the size of the remaining portion has reduced to zero, and, if not (i.e. 'N' at step 755), the method 700 progresses to step 760 where the controller 130 obtains the codeword offset of the next adjacent codeword CW(x+1) and the associated spill offset. The controller then writes the remaining portion of the spilled write data to the next adjacent codeword CW(x+1), from the start of the codeword to the spill offset (step 765).

At step 770 the controller determines the size of the remaining portion of the write data payload that has spilled to the next adjacent codeword, loops back to step 755 where the controller 130 ascertains if the size of the remaining portion is zero. If the size of the write data that has spilled over is zero, this indicates that all the write data has been written to the memory 140, and the method 700 returns (step 775) where the controller 130 waits for the next write request from the host 110. In some embodiments, the controller 130 may send a message to the host 110 to indicate that the write data has been successfully written to the memory 140.

As an example of processing a write request according to method 700, when the SSD 120 receives a write request from host 110 (step 705) with write data comprising payload P7 as shown in FIG. 5, the consumer module 194 checks the memory 140 for the next available space on the wordline and assigns an MCA to the payload P7 (step 710). The consumer module 194 then obtains codeword CW7 that corresponds to the assigned MCA by indexing into a look-up table 166 that maps each MCA in the memory 140 to the codeword offset along the respective wordlines in the NAND devices 141-143 (step 715). The consumer module 194 then determines the spill offset that corresponds to codeword CW7 using equations (1) to (4) or by indexing into the payload spill boundary table 182 with the codeword offset '7' (step 720). The consumer module 194 determines that the size of payload P7 is larger than the space available in codeword CW7 (from the spill boundary to the end of the codeword), which means that the write data payload P7 spills over the next adjacent codeword (i.e. 'Y' at step 725), that being codeword CW8. The consumer module 194 then determines if the next adjacent codeword CW8 is on a bad page, which it is (i.e. 'Y' at step 730). The consumer module 194 then skips to the next codeword CW12 on the next good NAND Page 3 in step 735. The consumer module 194 then repeats steps 720, 725 and 730 for codeword CW12.

As previously mentioned, when write data spills over to the next adjacent codeword and if the next adjacent codeword is on a bad NAND page, the consumer module moves to a codeword on the next good page. In the case of payload P7, this means that the consumer module does not store any portion of the payload P7 in codeword CW7 (from the spill offset to the end of the codeword) or in any of codewords CW8-CW11. Rather the consumer module 194 marks codewords CW8-CW11 as being on a bad page via bitmaps associated with each of codewords CW8-CW11, and skips to codeword CW12, the first codeword after codeword CW7 that is on the next good page. The consumer module 194 then directs the feeder module 192 to write the main portion of payload P7 in codeword CW12, from the spill offset to the end of the codeword (step 740). The consumer module 194 may store specific information about the codewords in a bitmap that is shared with the feeder module 192 such that the compute intensive steps are removed from the operation of the feeder module 192 thereby enabling the feeder module 192 to increase its speed of operation.

Once the main portion of payload P7 is written to codeword CW12, the controller 130 updates the LCA to MCA look-up table 162 so as to set a LCA pointer to the MCA of codeword CW12 in which the main portion of payload P7 begins (step 745). In step 750 the controller 130 determines the size of the remaining portion of payload P7 that has spilled over to the next adjacent codeword CW13, and ascertains that it is not zero (i.e. 'N' in step 755). The consumer module 194 then obtains the spill offset in codeword CW13 (step 760) in the same manner it did to obtain the spill offset in codeword CW12. The feeder module 192 then writes the remaining portion of payload P7 to codeword CW13 in step 765, from the start of the codeword to the spill offset of the codeword. The controller 130 then determines if the remaining portion of payload P7 has spilled over beyond the spill offset of codeword CW13 (step 770), which it has not (i.e. 'Y' at step 755). Once the payload P7 has been written to the memory 140, the controller 130 may send a message to the host 110 confirming completion of the write request. The controller then waits for the next request from the host 110 (step 775).

As a further example of processing a write request according to method 700, when the SSD 120 receives a write request from host 110 (step 705) with write data comprising payload P8 as shown in FIG. 5, the consumer module 194 checks the memory 140 for available space and assigns an MCA to the payload P8 (step 710). The consumer module 194 then obtains codeword CW13 that corresponds to the assigned MCA by indexing into a look-up table 166 that maps each MCA in the memory 140 to the codeword offset along the respective word lines in the NAND devices 141-143 (step 715). The consumer module 194 then determines the spill offset that corresponds to codeword CW13 using equations (1) to (4) or by indexing into the payload spill boundary table 182 with the codeword offset '13' (step 720). The consumer module 194 determines that the size of payload P8 is larger than the space available in codeword CW13 (from the spill boundary to the end of the codeword), which means that the write data payload P8 spills over the next adjacent codeword (i.e. 'Y' at step 725). The consumer module 194 then determines if the next adjacent codeword CW14 is on a bad NAND page, which it is not (i.e. 'N' at step 730). The consumer module 194 then directs the feeder module 192 to write the main portion of payload P8 in codeword CW13, from the spill offset to the end of the codeword (step 740). The consumer module 194 may use a bitmap containing specific information about codeword CW13 when instructing the feeder module 192.

Once the main portion of payload P8 is written to codeword CW12, the controller 130 updates the LCA to MCA look-up table 162 so as to set a LCA pointer to the MCA of codeword CW13 in which the main portion of payload P8 begins (step 745). In step 750 the controller 130 determines the size of the remaining portion of payload P8 that has spilled over to the next adjacent codeword CW14, and ascertains that it is not zero (i.e. 'N' in step 755). The consumer module 194 then obtains the spill offset in codeword CW14 (step 760) in the same manner it did to obtain the spill offset in codeword CW13. Note that for codeword CW14, the spill offset is as large as the codeword size. This is the point at which the spill offsets for the codewords on a word line cycle back to the initial difference between the codeword size and payload size, as can be seen in Table 1 where the spill offset reduce to 128 B. The feeder module 192 then writes the remaining portion of payload P8 to codeword CW14 in step 765, from the start of the codeword to the spill offset/end of the codeword. Here the entire codeword CW14 is used for the remaining portion of payload P8. The controller 130 then determines if the remaining portion of payload P8 has spilled over beyond the spill offset of codeword CW14 (step 770), which it has (i.e. 'N' at step 755). The controller then loops back and repeats steps 760, 765 and 770 for the next codeword CW15 into which the remaining porting of payload P8 has spilled. Once the payload P8 has been written to the memory 140, the controller 130 may send a message to the host 110 confirming completion of the write request. The controller then waits for the next request from the host 110 (step 775).

Figure 9:
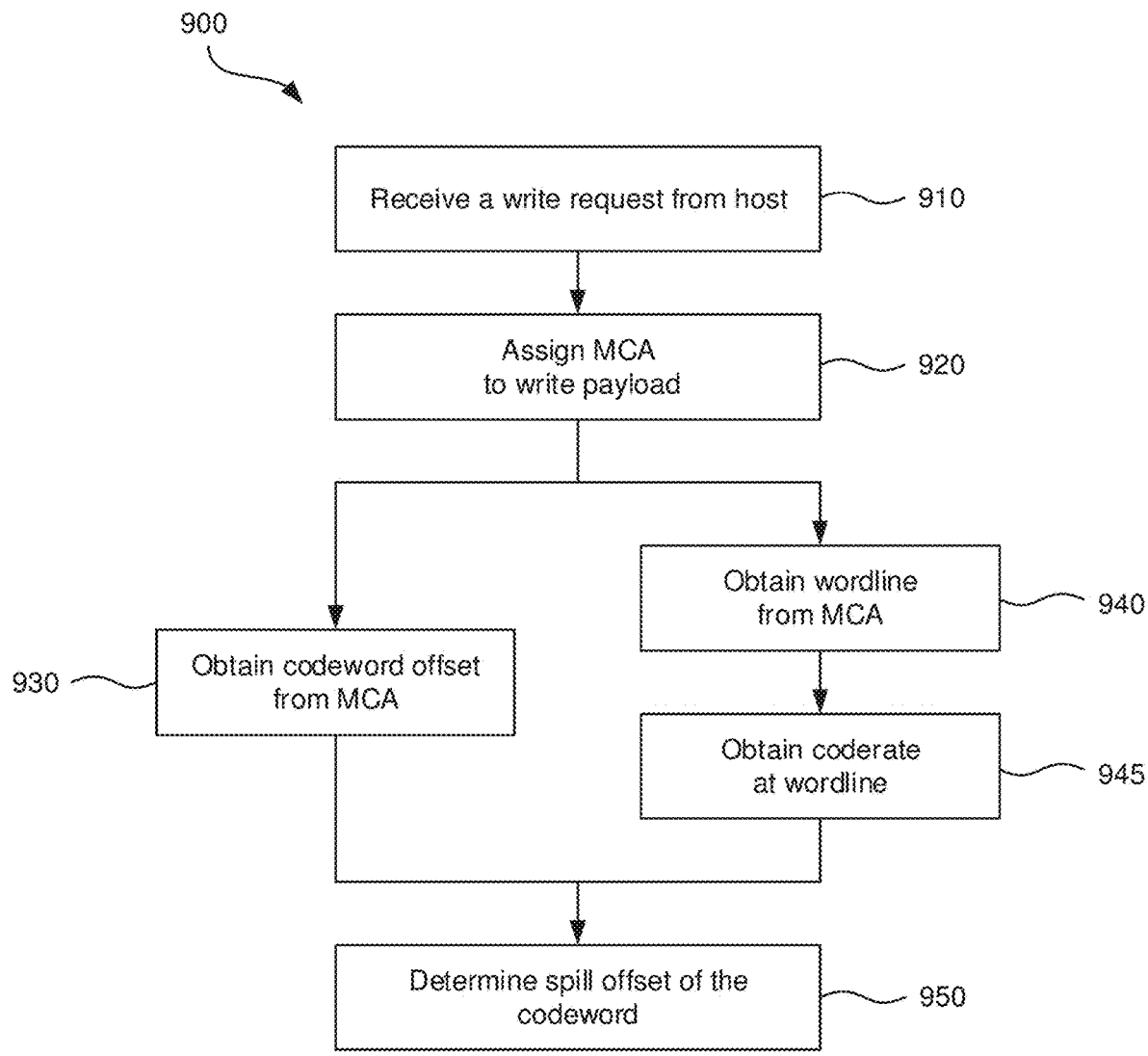
FIG. 9 is a flow diagram of a method for handling different coderates per wordline, according to one or more embodiments of the present disclosure.

FIG. 9 illustrates an exemplary flow diagram of a method 900 for determining the spill offset from a coderate specific payload spill boundary look-up table using a wordline-to-coderate table, such as the wordline-to-coderate table 810 shown in FIG. 8. The method 900 begins at step 910 where the controller 130 receives a host write request containing a payload of write data with an LCA. In some embodiments the controller 130 determines which of the NAND devices 141-143 in the memory 140 is available to store the payload of write data, and assigns an MCA of the available NAND to the write request (step 920). In step 930, the controller 130 uses the assigned MCA to obtain a codeword offset CW_Offset from a codeword offset module 164 where the MCA is used to index into a look-up table 166 that maps each MCA in the NAND devices 140 to the codeword offset in the NAND devices. The controller also uses the assigned MCA to obtain the wordline (WL) along which the codewords storing the read data are located (step 940). In step 945, the wordline is used to index into a wordline-to-coderate mapping table (such as tables 810 and 820 in FIG. 8, for example) to obtain a pointer to the appropriate payload spill boundary look up table. In step 950, the payload spill boundary table is indexed using the codeword offset CW_Offset to obtain the Spill Offset.

In the foregoing, all operations carried out by the controller 130, the feeder module 192 and the consumer module 194 are managed by instructions written to the firmware 172. In addition, all recitation of "module" or "layer" should be taken to mean a plurality of circuits within the controller that facilitates the function as described. Such circuits may comprise electronic components formed on a semiconductor chip, such as, for example, transistors and resistors. Additionally, all recitation of "codeword size" should be taken to mean the data length of a codeword, and such terms may be used interchangeably throughout the present disclosure. Further, all recitation of "storage elements," and "memory" are used interchangeably throughout the present disclosure, all of these terms referring to element 140 in FIG. 1 which comprises NAND devices 141-143. It should be noted that the term "about" or "approximately" indicates a range of ±20% of the stated value.

Other objects, advantages and embodiments of the various aspects of the present invention will be apparent to those who are skilled in the field of the invention and are within the scope of the description and the accompanying Figures. For example, but without limitation, structural or functional elements might be rearranged consistent with the present invention. Similarly, principles according to the present invention could be applied to other examples, which, even if not specifically described here in detail, would nevertheless be within the scope of the present invention.

The invention claimed is:

1. A solid state drive (SSD) comprising:
a plurality of nonvolatile semiconductor storage devices configured to store write data received from a host; and
a controller configured to perform the following steps:
receive a write request to store write data in one or more of the plurality of nonvolatile semiconductor storage devices,
identify a first codeword and a second codeword from a plurality of codewords stored in the one or more of the plurality of nonvolatile storage devices, the first codeword and the second codeword configured to store write data corresponding to the write request,
write a first portion of the write data to the first codeword and write a second portion of the write data to the second codeword, and
send a message to the host once the write data has been written to the nonvolatile semiconductor storage devices,
wherein the second codeword is adjacent to the first codeword as stored in the one or more of the plurality of nonvolatile storage devices, and the write data has a data length that is greater than a first data length of the first codeword or a second data length of the second codeword.

2. The SSD of claim 1, wherein prior to writing the first portion of the write data to the first codeword the controller is configured to perform the following step:
generate a bitmap in each codeword which identifies whether a codeword is located on a good page or a bad page.

3. The SSD of claim 2, wherein the controller is configured to perform the following steps:
read the bitmap associated with the codeword to determine if the second codeword is located on a bad page, and
skip to a codeword on a next good page if the second codeword is located on a bad page.

4. The SSD of claim 3, wherein the controller is configured to store a pointer for each codeword in a logical cluster address (LCA) to media cluster address (MCA) look up-table.

5. The SSD of claim 4, wherein the controller is configured to perform the following step:
update a pointer with an MCA corresponding to the first codeword at which the first portion of the write data begins.

6. The SSD of claim 5, wherein the controller is configured to perform the following steps:

determine a codeword offset corresponding to the MCA of the first codeword, the codeword offset identifying the first codeword in the plurality of codewords in which the write data begins, and determine a codeword offset corresponding to the MCA of the second codeword.

7. The SSD of claim 6, wherein the controller is configured to perform the following step:

identify a spill offset associated with the first codeword offset, the spill offset identifying a position within the first codeword at which the first portion of the write data begins.

8. The SSD of claim 7, wherein the controller is configured to perform the following steps:

write the first portion of the write data from the spill offset of the first codeword to the end of the first codeword, and write the second portion of the write data from the start of the second codeword to a spill offset of the second codeword.

9. The SSD of claim 8, wherein the controller is configured to perform the following steps:

calculate the second portion of the write data, and in response to the second portion of the write data spilling over to a next adjacent codeword, (i) determine a spill offset of the next adjacent codeword, and (ii) write the spilled second portion of the write data to the next adjacent codeword.

10. The SSD of claim 9, wherein a feeder module coupled to the host interface performs the writing steps.

11. The SSD of claim 10, wherein a consumer module coupled to the plurality of nonvolatile semiconductor storage devices performs all remaining steps of the controller.

12. The SSD of claim 7, wherein the first data length and the second data length are equal, and the controller is configured to perform the following steps:

determine a data spill per codeword by subtracting the first data length from a data length of the write data, determine a total spill in the nonvolatile semiconductor storage device for each codeword offset by multiplying the spill per codeword by the codeword offset, and determine the spill offset by dividing the total spill by the first data length.

13. The SSD of claim 7, wherein the plurality of codewords are stored on one or more wordlines in the nonvolatile semiconductor storage devices.

14. The SSD of claim 13, wherein each of the wordline has a different code rate.

15. The SSD of claim 14, wherein the controller is configured to perform the following step:

generate a payload spill boundary look-up table for each code rate.

16. The SSD of claim 15, wherein the controller is configured to perform the following step:

store the code rate of the nonvolatile semiconductor storages device in a configuration file in a read-only memory within the controller.

17. The SSD of claim 16, wherein the controller is configured to perform the following steps:

determine a bit error rate associated with each of the plurality of nonvolatile semiconductor storage devices, adjust the code rate of at least one of the nonvolatile semiconductor storage devices based on the bit error rate, and update the code rate in the configuration file.

18. The SSD of claim 1, wherein the controller is configured to perform the following step:

index into a codeword look-up table which maps an MCA in the nonvolatile semiconductor storage devices at which the write is to be stored.

19. The SSD of claim 18, wherein the controller is configured to perform the following step:

index into a payload spill boundary look-up table which maps a codeword in the nonvolatile semiconductor storages devices to a spill offset.

20. The SSD of claim 1, wherein each of the plurality of the nonvolatile semiconductor storage devices comprises a NAND memory.

21. A solid state drive (SSD) comprising:

a plurality of nonvolatile semiconductor storage devices configured to store write data received from a host; and a controller configured to perform the following steps:

receive a write request to store write data in one or more of the plurality of nonvolatile semiconductor storage devices, identify a first codeword and a second codeword from a plurality of codewords stored in the one or more of the plurality of nonvolatile storage devices, the first codeword being offset along a first wordline and the second codeword being offset along a second wordline, the first codeword and the second codeword configured to store write data corresponding to the write request, determine a first coderate of the first wordline and a second coderate of the second wordline, and write a first portion of the write data to the first codeword using the first coderate and write a second portion of the write data to the second codeword using the second coderate, wherein the write data has a data length that is greater than a first data length of the first codeword or a second data length of the second codeword.

22. The SSD of claim 21, wherein the controller is configured to perform the following step:

access a wordline to code rate table stored in a configuration file to determine the first code rate and the second code rate.

23. The SSD of claim 22, wherein the plurality of codewords are stored on one or more wordlines in the nonvolatile semiconductor storage devices.

24. The SSD of claim 23, wherein the controller is configured to perform the following step:

generate a payload spill boundary look-up table for each code rate.

25. The SSD of claim 24, wherein the controller is configured to perform the following step:

store the code rate of the nonvolatile semiconductor storages device in a configuration file in a read-only memory within the controller.

26. The SSD of claim 25, wherein the controller is configured to perform the following steps:

determine a bit error rate associated with each of the plurality of nonvolatile semiconductor storage devices, adjust the code rate of at least one of the nonvolatile semiconductor storage devices based on the bit error rate, and update the code rate in the configuration file.

27. The SSD of claim 21, wherein the controller is configured to store a pointer for each codeword in a logical cluster address (LCA) to media cluster address (MCA) look up-table.

28. The SSD of claim 27, wherein the controller is configured to perform the following steps:

determine a codeword offset corresponding to the MCA of the first codeword for the first code rate, the codeword offset identifying the first codeword in the plurality of codewords in which the write data begins, and determine a codeword offset corresponding to the MCA of the second codeword for the second code rate.

29. The SSD of claim 28, wherein the controller is configured to perform the following step:

update a pointer with an MCA corresponding to the first codeword at which the first portion of the write data begins.

30. The SSD of claim 28, wherein prior to writing the first portion of the write data to the first codeword, the controller is configured to perform the following step:

generate a bitmap in each codeword which identifies whether a codeword is located on a good page or a bad page.

31. The SSD of claim 30, wherein the controller is configured to perform the following steps:

read the bitmap associated with the codeword to determine if the second codeword is located on a bad page, and skip to a codeword on a next good page if the second codeword is located on a bad page.

32. The SSD of claim 28, wherein the controller is configured to perform the following steps:

identify a first spill offset associated with the first codeword offset at the first code rate, wherein the first spill offset identifies a position within the first codeword at which the first portion of the write data begins, and identify a second spill offset associated with the second codeword offset at the second code rate, wherein the second spill offset identifies a position within the second codeword at which the second portion of the write data ends.

33. The SSD of claim 32, wherein the controller is configured to perform the following steps:

write the first portion of the write data from the first spill offset of the first codeword to the end of the first codeword, and write the second portion of the write data from the start of the second codeword to the second spill offset of the second codeword.

34. The SSD of claim 33, wherein the controller is configured to perform the following steps:

calculate the second portion of the write data, and responsive to the second portion of the write data spilling over to a next adjacent codeword, (i) determine a spill offset of the next adjacent codeword, and (ii) write the spilled second portion of the write data to the next adjacent codeword.

35. The SSD of claim 34, wherein a feeder module coupled to the host interface performs the writing steps.

36. The SSD of claim 35, wherein a consumer module coupled to the plurality of nonvolatile semiconductor storage devices performs all remaining steps of the controller.

37. The SSD of claim 21, the second codeword is adjacent to the first codeword as stored in the one or more of the plurality of nonvolatile storage devices.

38. The SSD of claim 21, wherein the first wordline is the same as the second wordline.

39. The SSD of claim 21, wherein the first data length and the second data length are equal, and the controller is configured to perform the following steps:

determine a data spill per codeword by subtracting the first data length from a data length of the write data, determine a total spill in the nonvolatile semiconductor storage device for each codeword offset by multiplying the spill per codeword by the codeword offset, and determine the spill offset by dividing the total spill by the first data length.

40. The SSD of claim 21, wherein the controller is configured to perform the following step:

index into a codeword look-up table which maps an MCA in the nonvolatile semiconductor storage devices at which the write is to be stored.

41. The SSD of claim 40, wherein the controller is configured to perform the following step:

index into a payload spill boundary look-up table which maps a codeword in the nonvolatile semiconductor storages devices to a spill offset.

42. The SSD of claim 41, wherein each of the plurality of the nonvolatile semiconductor storage devices comprises a NAND memory.

* * * * *